United States Patent

Yabuuchi

[11] Patent Number: 5,881,082
[45] Date of Patent: Mar. 9, 1999

[54] PULSED POWER SUPPLY UNIT FOR A PULSED LASER

[75] Inventor: Masataka Yabuuchi, Tokyo, Japan

[73] Assignee: Mitsubishi Denki Kabushiki Kaisha, Tokyo, Japan

[21] Appl. No.: 924,995

[22] Filed: Sep. 5, 1997

[30] Foreign Application Priority Data

Sep. 6, 1996 [JP] Japan ................................ 8-236774

[51] Int. Cl.⁶ .............................. H01S 3/09; H05B 41/30
[52] U.S. Cl. ...................... 372/38; 315/209 CD; 372/25; 323/901
[58] Field of Search ................... 372/25, 30, 38, 372/82, 109; 323/901; 315/209 CD

[56] References Cited

U.S. PATENT DOCUMENTS

| | | | |
|---|---|---|---|
| 4,276,497 | 6/1981 | Burbeck et al. | 372/38 X |
| 4,405,889 | 9/1983 | Overstreet et al. | 323/282 |
| 4,405,975 | 9/1983 | Overstreet et al. | 363/49 |
| 5,048,033 | 9/1991 | Donahue et al. | 372/38 |
| 5,596,593 | 1/1997 | Crothall et al. | 372/82 X |

FOREIGN PATENT DOCUMENTS 7-231678  8/1995  Japan .

OTHER PUBLICATIONS

D. Chatroux and J. Maury, "IGBT: A Solid State Switch," SPIE, vol. 1859, pp. 145–153, (1993) [No Month].

Primary Examiner—John D. Lee
Attorney, Agent, or Firm—Sughrue, Mion, Zinn, Macpeak & Seas, PLLC

[57] ABSTRACT

A small-sized pulsed power supply unit capable of being manufactured at low cost. A switch (4) is connected in parallel to a capacitor (5) and a discharge load (6) in such a manner that it forms a closed circuit together with a DC voltage source (1) and a reactor (2) when the switch (4) is turned on, so as to store electromagnetic energy in the reactor (2), and a closed circuit together with the reactor (2), the capacitor (5) and the discharge load (6) when the switch (4) is turned off, so as to charge the electromagnetic energy stored in the reactor (2) to the capacitor (5) as electrostatic energy at a charge voltage higher than an output DC voltage of the DC voltage source (1). A voltage detector (7) detects the voltage of the DC voltage source (1), and a current detector (8) detects a current flowing through the reactor (2). A control circuit (9A) switches on and off the switch (4) based on the detected voltage and the detected current.

4 Claims, 3 Drawing Sheets

PULSED POWER SUPPLY UNIT FOR A PULSED LASER

BACKGROUND OF THE INVENTION

1. Field of the Invention

The present invention relates to a pulsed power supply unit for generating excitation energy of a pulsed laser such as a copper vapor laser, an excimer laser and a carbon dioxide laser.

2. Description of the Related Art

FIG. 5 shows a conventional pulsed power supply unit, for example, disclosed in Japanese Laid-Open Patent Publication No. HEI-4-200281. In FIG. 5, the conventional pulsed power supply unit illustrated comprises a DC voltage source 1 for generating a DC voltage, a reactor 2 whose one end is connected to a positive output terminal of the DC voltage source 1, a switch 4 connected in parallel to the DC voltage source 1, a capacitor 5 whose one end is connected to the other end of the reactor 2, a discharge load 6 connected to the other end of the capacitor 5, and a control circuit 9 for turning the switch 4 on and off.

Operation of the conventional pulsed power supply unit will be described below.

When the switch 4 is switched off by the control circuit 9, a current flows from the positive output terminal of the DC voltage source 1 through the reactor 2 and the capacitor 5 to the discharge load 6, thereby charging the capacitor 5 up to reaching an output voltage value of the DC voltage source.

Once the switch 4 is switched on by the control circuit 9, a current flows steeply from the switch 4 to the discharge load 6. As a result, electrostatic energy stored in the capacitor 5 is inputted to the discharge load 6.

The discharge load 6 laser-oscillates inside thereof using the energy as an excitation source, thereby generating a laser output light in proportion to the energy inputted. When the switch 4 is switched off by the control circuit 9 after a completion of these operations, charging of the capacitor 5 begins again. These operations are repeated approximately some hundreds to some thousands times per second. The switch 4 is switched repeatedly with high voltages and a large amount of currents at high speed. Consequently, a semiconductor switch composed of a semiconductor device is used for the switch 4.

Since the conventional positive power supply is constituted as described above, a charging voltage value of the capacitor needs to be set highly precisely for stabilizing a laser output. In this regard, however, since the charging voltage value is determined by the accuracy in the output voltage of the DC voltage source, the DC voltage source should have a high voltage and a high degree of precision. Such a fact results in a large-sized power supply unit and a high cost.

SUMMARY OF THE INVENTION

In view of the above, the present invention is intended to solve such problems as encountered with the conventional pulsed power supply unit.

An object of the present invention is to obtain a pulsed power supply unit of the character described which does not require a high degree of precision with a DC voltage source, and which can be miniaturized and manufactured at low cost, and in which an output voltage value of the DC voltage source can be significantly decreased, while allowing a charging voltage to be kept with high precision.

Bearing the above object in mind, according to the present invention, there is provided a pulsed power supply unit comprising:

a DC voltage source for generating a DC voltage;

a reactor connected to the DC voltage source;

a diode for regulating a current to flow through the reactor in one direction;

a charging capacitor connected to the reactor;

a discharge load connected to the reactor via the capacitor;

a switch connected in parallel to the capacitor and the discharge load in such a manner that it forms a closed circuit together with the DC voltage source and the reactor when the switch is turned on, so as to store electromagnetic energy in the reactor, and a closed circuit together with the capacitor and the discharge load when the switch is turned off, so as to store the electromagnetic energy in the capacitor as electrostatic energy at a charge voltage higher than the DC voltage generated by the DC voltage source;

a voltage detector for detecting a voltage of the DC voltage source;

a current detector for detecting a current flowing through the reactor; and a control circuit for switching on and off the switch based on the detected voltage and the detected current.

In one preferred form of the present invention, the control circuit is constructed such that it turns off the switch based on the detected voltage when the detected current reaches a predetermined value.

In another preferred form of the present invention, the control circuit calculates a current value with the following equation:

$$Im = K \cdot I_s$$

(where $K = \sqrt{((V^*/E-1)^2-1)}$, $I_s = E \cdot \sqrt{(C/L)}$, $V^*$ is a desired charge voltage value of the load capacitor, E is the voltage value of the DC voltage source, C is a capacitance value of the load capacitor and L is an inductance value of the reactor) and turns off the switch when the detected current value reaches the calculated current value obtained by the equation.

In a further preferred form of the present invention, the DC voltage source comprises a transformer adapted to be connected to an AC power supply for increasing an output voltage thereof, and a rectifier circuit connected to the transformer for rectifying an AC voltage of the transformer.

The above and other objects, features and advantages of the present invention will more readily apparent from the following detailed description of preferred embodiments of the invention when taken in conjunction with the accompanying drawings.

DESCRIPTION OF THE PREFERRED EMBODIMENTS

Preferred embodiments of the present invention will be described below while referring to accompanying drawings.

Embodiment 1

Figure 1:
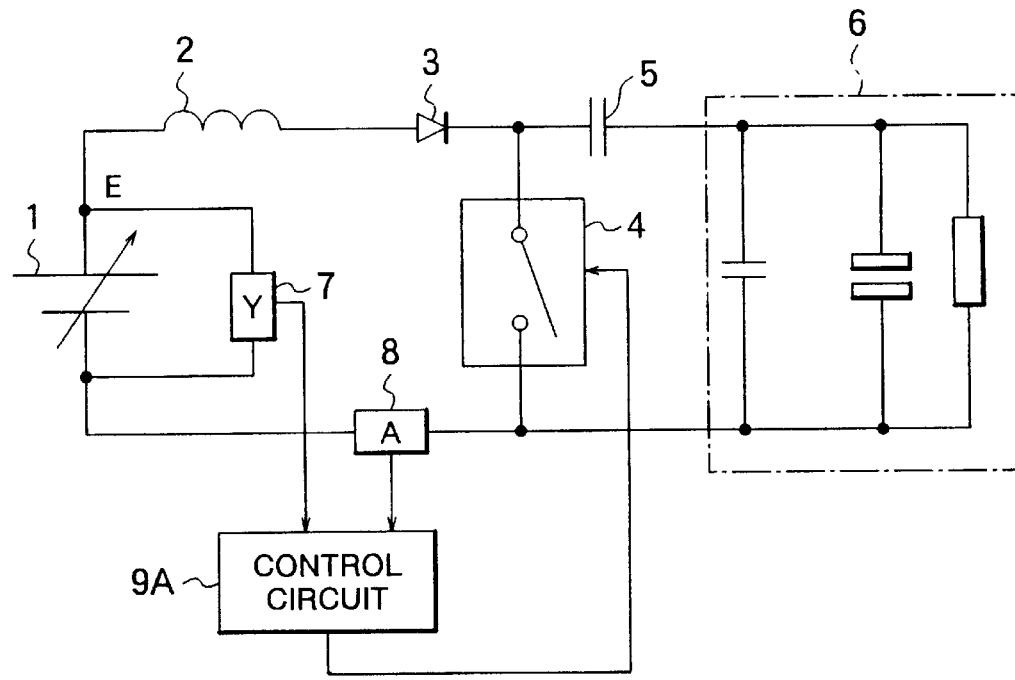
FIG. 1 is a block diagram showing a construction of the pulsed power supply unit according to a first embodiment of the present invention.

Referring first to FIG. 1, this figure schematically illustrates a pulsed power supply unit generally constructed in accordance with a first embodiment (thereinafter simply referred to as Embodiment 1) of the present invention. The pulsed power supply unit of this embodiment comprises a DC voltage source 1, a reactor 2 whose one end is connected to a positive output terminal of the DC voltage source 1, a diode 3 for regulating a current flowing through the reactor 2 in one direction, an on/off switch 4 having one end thereof connected between the diode 3 and a capacitor 5 to be described later and the other end thereof connected to a negative output terminal of the DC voltage source 1.

The capacitor 5 has one end thereof connected to a cathode of the diode 3 and the other end thereof connected to a discharge load 6. A voltage detector 7 is connected to both terminals of the DC voltage source 1 and detects a voltage of the DC voltage source 1. A current detector 8 is connected between the negative output terminal of the DC voltage source 1 and the switch 4 and detects a current flowing through the reactor 2. An input side of a control circuit 9A is connected to the voltage detector 7 and the current detector 8 and an output side of the control circuit 9A is connected to a control terminal of the switch 4. The control circuit 9A is supplied with a voltage detected by the voltage detector 7 and a current detected by the current detector 8 for turning the switch 4 on and off.

The switch 4 is connected in parallel to the capacitor 5 and the discharge load 6, such that upon closure or turning on of the switch 4, it forms a closed circuit together with the DC voltage source 1 and the reactor 2 so as to store electromagnetic energy in the reactor 2, and upon opening or turning off of the switch 4, it forms a closed circuit together with the reactor 2, capacitor 5 and the discharge load 6 so as to charge the electromagnetic energy which is stored in the reactor 2 to the capacitor 5 as electrostatic energy at a charged voltage higher than the output DC voltage of the DC voltage source 1.

The operation of Embodiment 1 will then be described. When the switch 4 is switched on, both output terminals of the DC voltage source 1 is short-circuited with the reactor 2. A current I flowing through the reactor 2 is represented by the following equation:

$$I = E/L \times T$$

where T is an ON period, E is an output voltage of the DC voltage source 1 and L is an inductance value of the reactor 2. In case of the value of E being deemed constant during the ON period of the switch 4, the current depending proportionally on the switch ON period is stored in the reactor 2 as electromagnetic energy. When the switch 4 is switched off, a charged current flows from the DC voltage source 1 to the capacitor 5 through the reactor 2 and the diode 3. A current Im, which flows through the reactor 2 just before the switch 4 is switched off, is added to the charged current as an initial value.

If the initial current is not present, a maximum value $I_s$ of the charged current is represented by the following equation:

$$I_s = E \times \sqrt{C/L}$$

where C is an electrostatic capacity of the capacitor 5. Consequently, the charged current I after the switched 4 is switched off is represented by the following sum:

$$Im \cos(\omega t) + Is \sin(\omega t)$$

Assuming that the value of t is zero when the switch 4 is off, the charged current I flows in a forward direction of the diode 3 for a predetermined period. When the current gradually decreasing reaches zero, the direction of the current flow is to be reversed. However, the diode 3 inhibits reversing the current to thereby complete the charging of the capacitor 5. Similar to a mechanism of a booster chopper, the charging voltage value can be theoretically many times (not less than two times) larger than the output voltage E of the DC voltage source 1.

When the switch 4 is then switched on, the electrostatic energy stored in the capacitor 5 is supplied to the discharge load 6 via the switch 4 in an extreme short time, and at the same time electromagnetic energy again starts to be stored in the reactor 2. During these sequential operations, the charging voltage value $V_c$ of the capacitor 5 is determined by the charging current I.

When the output voltage value E of the DC voltage source 1 and the current value I flowing through the reactor 2 are detected, the above-mentioned currents Im and Is are obtained, thus making it possible to control the charging voltage value. In FIG. 1, the output voltage value E is detected by the voltage detector 7 and the current value I of the reactor 2 is detected by the current detector 8, so that the voltage value E and the current value I thus detected are inputted to the control circuit 9. The control circuit 9 switches on and off the switch 4 using these detected values to obtain a desired charging voltage value which will be described later.

As described above, according to Embodiment 1, the charging voltage value can be controlled precisely without requiring high accuracy of the output voltage of the DC voltage source, and also the required output voltage of the DC voltage source can be significantly lowered in comparison with the charge voltage.

Embodiment 2

One exemplary operation of the control circuit in Embodiment 1 will be described while referring to FIG. 2 which shows a time chart for explaining the operation of the control circuit.

Figure 2:
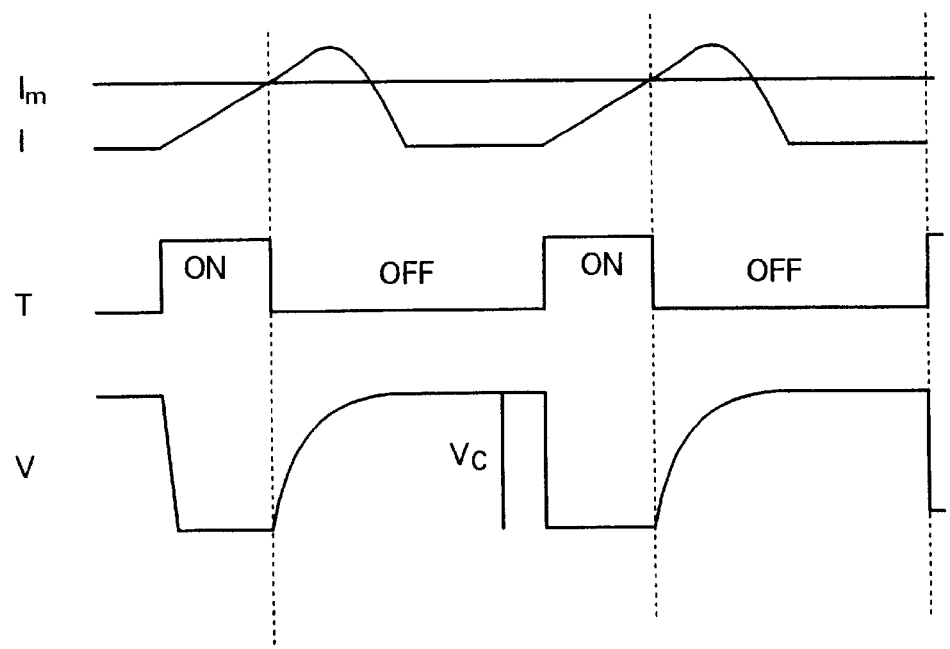
FIG. 2 is a timing chart showing an operation of a second embodiment of the present invention.

In FIG. 2, reference symbol Im represents a current value to be supplied to the reactor 2 just before the switch 4 is switched off, so as to obtain a desired charging voltage; reference symbol I represents a waveform of a current flowing through the reactor 2 as detected by the current detector 8; reference symbol T represents an on/off control signal of the switch 4; and reference symbol V represents the waveform of the charging voltage of the capacitor 5. In this embodiment, the switch 4 is designed to be switched off for charging the capacitor 5 when the value of the current flowing through the reactor 2 exceeds the current value Im.

After a period of time sufficiently longer than the charging period from the start to end of charging has elapsed from the completion of the charging, the control circuit 9A commands the switch 4 so that the switch 4 is turned on. As described later, if the current value Im is calculated from a desired charge voltage value and a voltage value E at that point, the ON period of the switch 4 can be controlled by a simple comparison of the presently detected current value to the current value Im, thereby obtaining the desired charge voltage value in an easy manner.

Embodiment 3

One example of finding the current value Im in Embodiment 2 will be described below.

Figure 3:
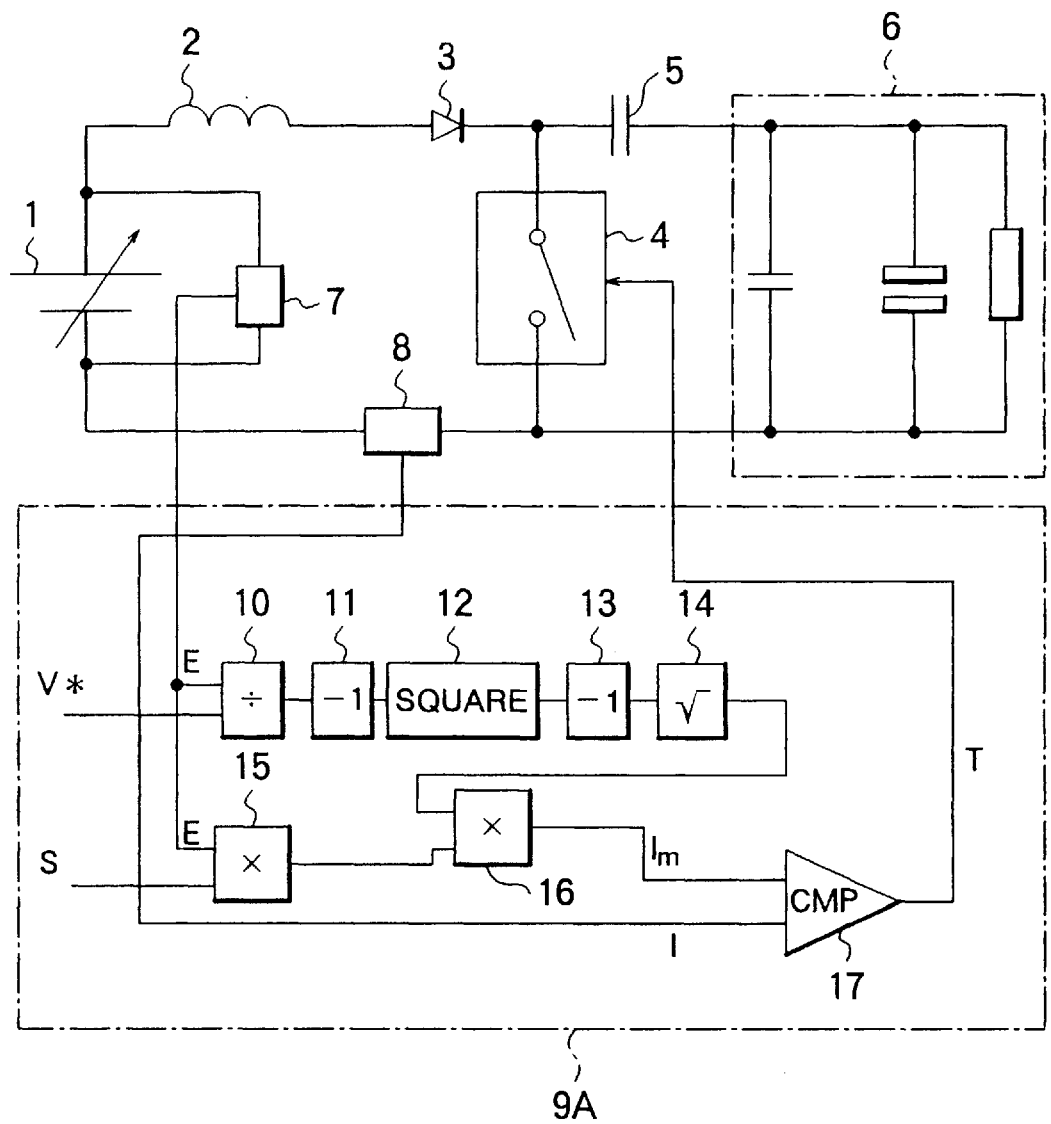
FIG. 3 is a control block diagram showing a construction of a third embodiment of the present invention.

In FIG. 3, reference symbol V* represents a desired charge voltage; reference numeral 10 represents a divider for finding a value of V*/E where V* is the desired charge voltage and E is a detected voltage value detected by the current detector 7; reference numeral 11 represents a subtracter connected to an output side of the divider 10 for subtracting a value of 1 from the output thereof; reference numeral 12 represents a square operator connected to an output side of the subtracter 11 for squaring the output thereof; reference numeral 13 represents a subtracter connected to an output side of the square operator 12 for subtracting a value of 1 from the output thereof; reference numeral 14 represents a square root operator connected to an output side of the subtracter 13 for finding the square root from the output thereof; reference numeral 15 represents a multiplier for multiplying the detected voltage value E and a value S to be described later; reference numeral 16 represents a multiplier connected to output sides of the multiplier 15 and the square root operator 14 for multiplying these outputs to find the current value Im; and reference numeral 17 represents a comparison circuit connected to output sides of the multiplier 16 and the current detector 8 for comparing these two outputs.

Under such a construction, the current value Im to be supplied to the reactor 2 just before the switch 4 is switched off is found using the following equation:

$$Im = K \times E \times S$$

Where $K=\sqrt{((V^*/E-1)^2-1)}$ and $S=\sqrt{(C/L)}$. The current value Im, which is used for obtaining the desired charge voltage $V^*$, is found easily and accurately by the above equation.

Embodiment 4

One concrete example of the DC voltage source referred to in the aforementioned Embodiments 1 to 3 will be described in detail.

Figure 4:
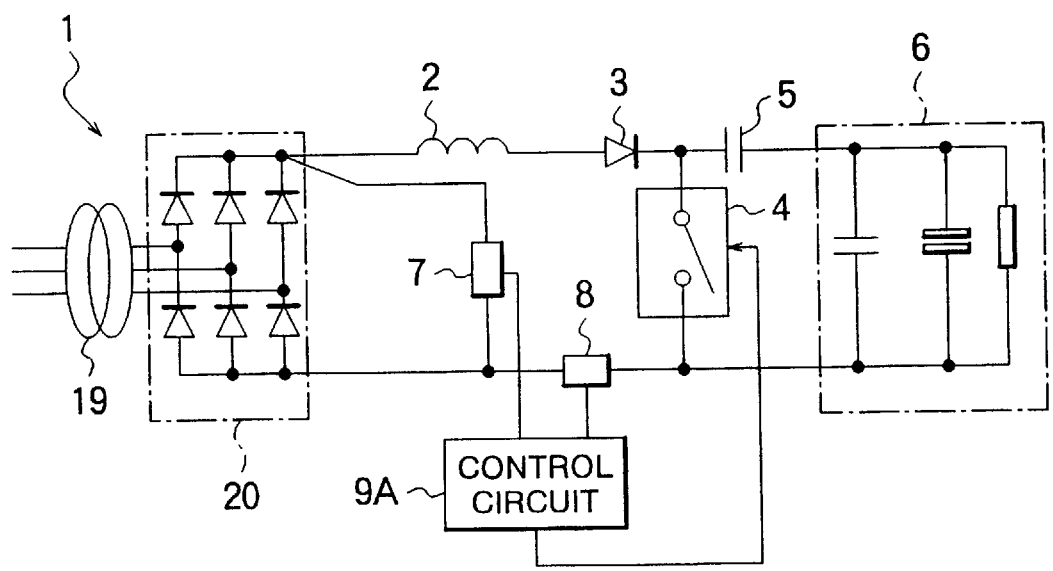
FIG. 4 is a block diagram showing a construction of a fourth embodiment of the present invention.
Figure 5:
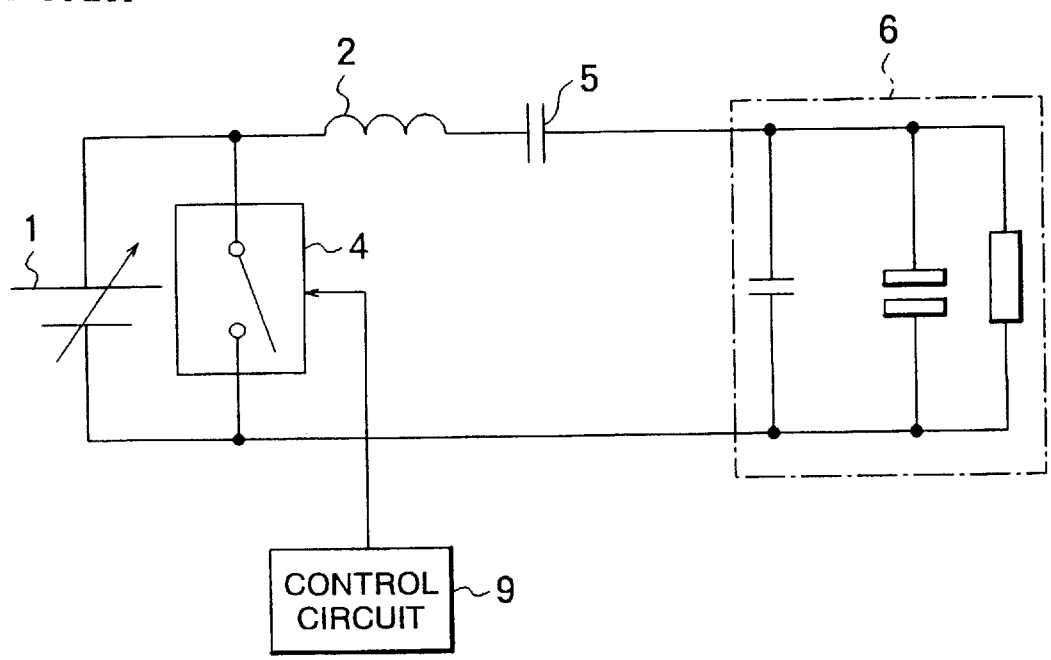
FIG. 5 is a block diagram showing a conventional pulsed power supply unit.

In FIG. 4, the DC voltage source 1 comprises a transformer 19 adapted to be connected to an AC power supply in the form of a single-phase or three-phase commercially available AC power supply (not shown) for increasing an output voltage thereof, and a rectifier circuit 20 in the form of a single-phase or three-phase bridge rectifier circuit including a plurality of diodes connected to the transformer 19 for rectifying a single-phase or three-phase AC voltage of the transformer. With the DC voltage source 1 as constructed above, the charge voltage of the capacitor 5 is controlled flexibly or optionally by means of the control circuit 9, so that accuracy of the output voltage of the DC voltage source is not required. Moreover, according to such a construction, a general transformer such as 400V/6.6 kV can be used, thereby simplifying the construction of the pulsed power supply unit while contributing to a reduction in cost.

As described in the foregoing, the pulsed power supply unit of the present invention comprises: a DC voltage source for generating a DC voltage; a reactor connected to the DC voltage source; a diode for regulating a current to flow through the reactor in one direction; a charging capacitor connected to the reactor; a discharge load connected to the reactor via the capacitor; a switch connected in parallel to the capacitor and the discharge load in such a manner that it forms a closed circuit together with the DC voltage source and the reactor when the switch is turned on, so as to store electromagnetic energy in the reactor, and a closed circuit together with the capacitor and the discharge load when the switch is turned off, so as to store the electromagnetic energy in the capacitor as electrostatic energy at a charge voltage higher than the DC voltage generated by the DC voltage source; a voltage detector for detecting a voltage of the DC voltage source; a current detector for detecting a current flowing through the reactor; and a control circuit for switching on and off the switch based on the detected voltage and the detected current.

With such a construction, since the DC voltage source requires no output voltage control function, the charge voltage can be controlled in an accurate manner without directly detecting the charge voltage. In addition, the pulsed power supply unit is less liable to charging noise or switching noise, thus resulting in a stable operation. Furthermore, the DC voltage value required can be substantially decreased as compared to the charge voltage value, thereby reducing the output voltage of the DC voltage source. Accordingly, the construction of the pulsed power supply unit is significantly simplified to realize a miniaturization and a low cost.

The above-described control circuit may be constructed such that the switch is turned off based on the voltage detected when the current detected reaches a predetermined value. With this construction, in addition to the above advantage, there will be provided another advantage that the ON time of the switch can be controlled by a simple comparison of the detected current value to the predetermined current value, thereby obtaining the desired charge voltage value quite an easy manner.

Furthermore, the above-described control circuit preferably calculates a current value with the following equation:

$$Im = K \cdot I_s$$

(where $K=\sqrt{((V^*/E-1)^2-1)}$, $I_s=E\cdot\sqrt{(C/L)}$, $V^*$ is a desired charge voltage value of the load capacitor, E is the voltage value of the DC voltage source, C is a capacitance value of the load capacitor and L is an inductance value of the reactor) and turns off the switch when the detected current value reaches a calculated value obtained by the above equation. This construction provides, in addition to the above advantages, a further advantage that the current value Im required for obtaining the desired charge voltage $V^*$ can be given more easily and accurately.

Moreover, the DC voltage source may preferably comprise a transformer adapted to be connected to an AC power supply for increasing an output voltage thereof, and a rectifier circuit connected to the transformer for rectifying an output voltage of the transformer. With this construction, in addition to the above advantages, there is provided a further advantage that a high degree of accuracy in the output voltage of the DC voltage source is not required, allowing the use of a general-purpose transformer, as a consequence of which the construction of the pulsed power supply unit can be further simplified, thus contributing to a further reduction in cost.

What is claimed is:

1. A pulsed power supply unit comprising:

a DC voltage source for generating a DC voltage;

a reactor connected to the DC voltage source;

a diode for regulating a current to flow through the reactor in one direction;

a charging capacitor connected to the reactor;

a discharge load connected to the reactor via the capacitor;

a switch connected in parallel to the capacitor and the discharge load in such a manner that it forms a closed circuit together with the DC voltage source and the reactor when the switch is turned on, so as to store electromagnetic energy in the reactor, and a closed circuit together with the capacitor and the discharge load when the switch is turned off, so as to store the electromagnetic energy in the capacitor as electrostatic energy at a charge voltage higher than the DC voltage generated by the DC voltage source;

a voltage detector for detecting a voltage of the DC voltage source;

a current detector for detecting a current flowing through the reactor; and a control circuit for switching on and off the switch based on the voltage detected and the current detected.

2. A pulsed power supply unit according to claim 1, wherein the control circuit turns off the switch based on the detected voltage when the detected current reaches a predetermined value.

3. A pulsed power supply unit according to claim 2, wherein the control circuit calculates a current value with the following equation:

$$Im = K \cdot I_s$$

(where $K = \sqrt{((V^*/E - 1)^2 - 1)}$, $I_s = E \cdot \sqrt{(C/L)}$, $V^*$ is the desired charge voltage value of the load capacitor, E is the voltage value of the DC voltage source, C is a capacitance value of the load capacitor and L is an inductance value of the reactor) and turns off the switch when the detected current value reaches the calculated value obtained by the equation.

4. A pulsed power supply unit according to claim 1, wherein the DC voltage source comprises a transformer adapted to be connected to an AC power supply for increasing an output voltage thereof, and a rectifier circuit connected to the transformer for rectifying an AC voltage of the transformer.

* * * * *